(12) United States Patent  
Wich

(10) Patent No.: US 7,071,748 B2  
(45) Date of Patent: Jul. 4, 2006

(54) CHARGE PUMP CLOCK FOR NON-VOLATILE MEMORIES

(75) Inventor: Mathew T. Wich, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 106 days.

(21) Appl. No.: 10/831,907

(22) Filed: Apr. 26, 2004

(65) Prior Publication Data

US 2005/0237101 A1 Oct. 27, 2005

(51) Int. Cl.  
*H03K 5/26* (2006.01)  
*H03K 7/08* (2006.01)

(52) U.S. Cl. .................... 327/176; 327/24; 327/113

(58) Field of Classification Search ............... None  
See application file for complete search history.

(56) References Cited

U.S. PATENT DOCUMENTS 6,560,145 B1 5/2003 Martines et al. ....... 365/185.18  
6,778,454 B1* 8/2004 Duh et al. ................ 365/221  
2005/0018514 A1* 1/2005 Knaack et al. ............ 365/221

* cited by examiner

*Primary Examiner*—Timothy P. Callahan  
*Assistant Examiner*—Terry L. Englund  
(74) *Attorney, Agent, or Firm*—Schneck & Schneck; Thomas Schneck

(57) ABSTRACT

A charge pump clock for a memory device wherein pump clock signals are generated at an adaptive rate. The circuit of the present invention generates clock edges at a minimum of $T_D$ seconds apart so long as address transitions do not exceed a pre-determined limit. However, if address changes are occurring more frequently than this limit, i.e., $1/(2*T_D)$, then clock edges will be generated at a rate that is proportional to the rate of address changes, where $T_D$ is approximately half of the address period. Two logic rules are implemented in hardware or equivalent software to make the clock signal adjustments.

10 Claims, 4 Drawing Sheets

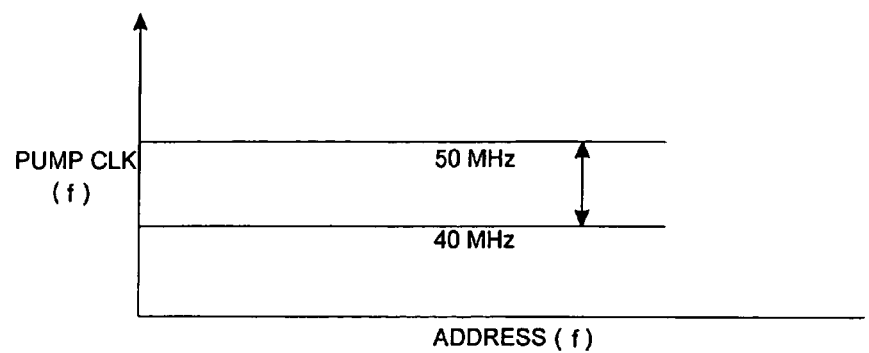
Fig._1 *(Prior Art)*
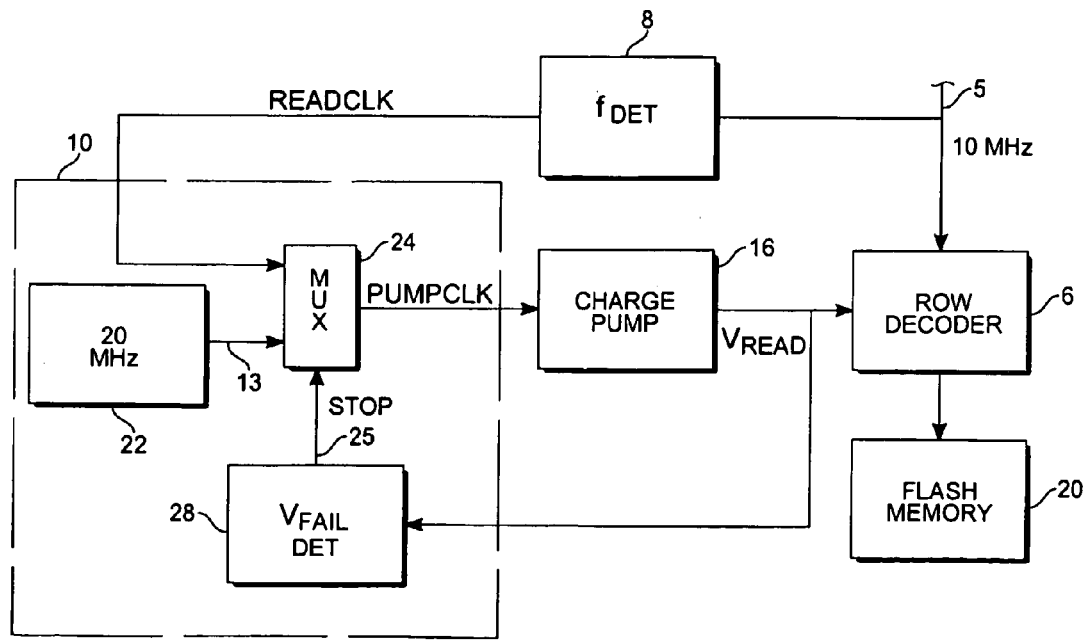
Fig._2 *(Prior Art)*

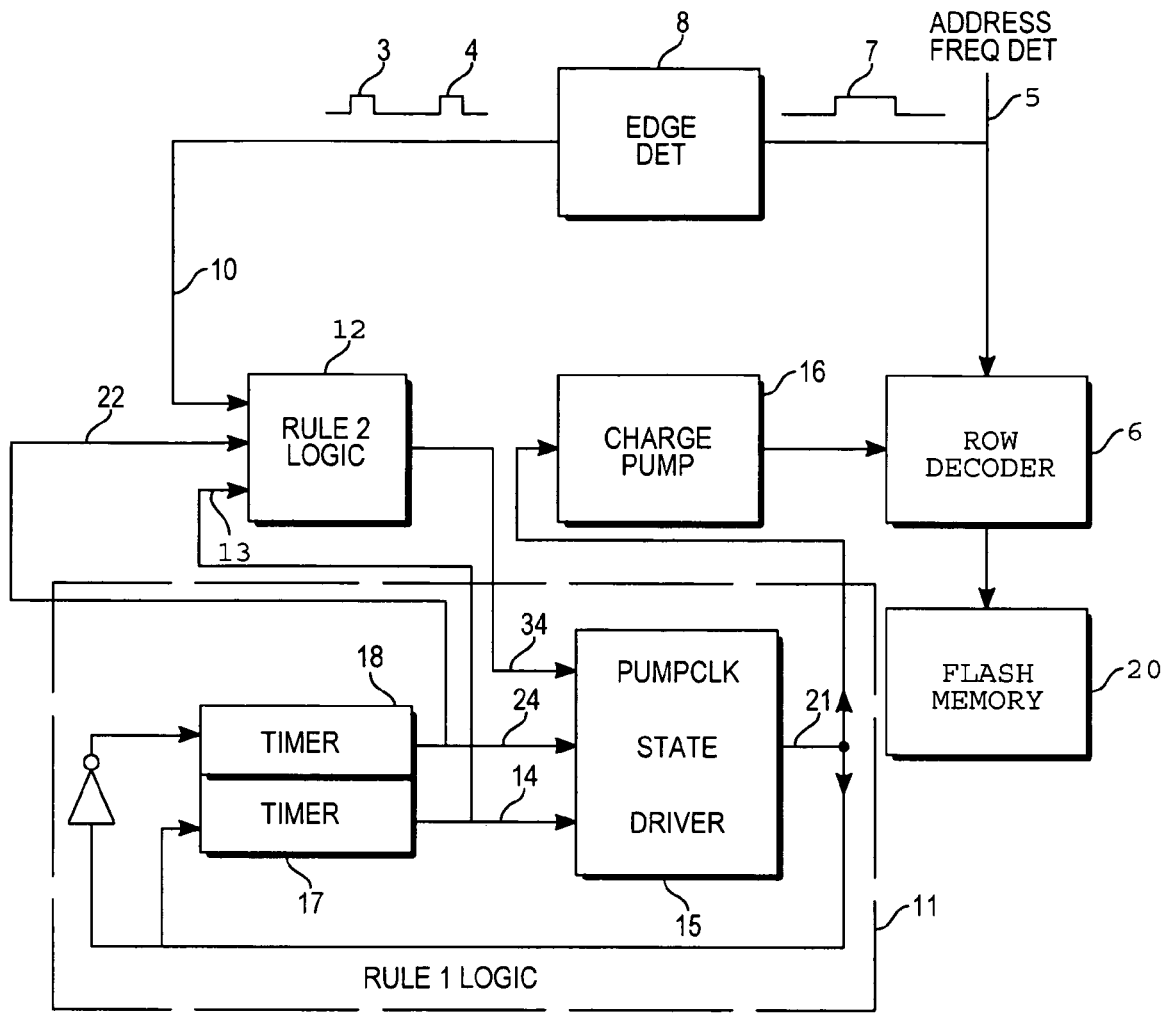
Fig._3
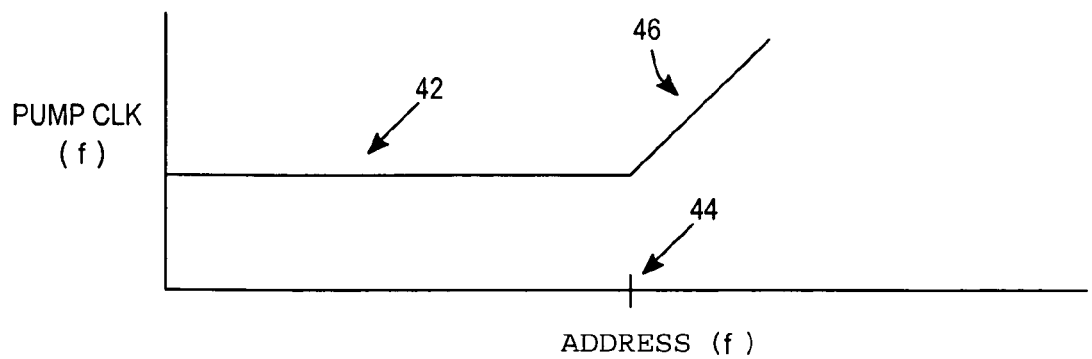
Fig._4

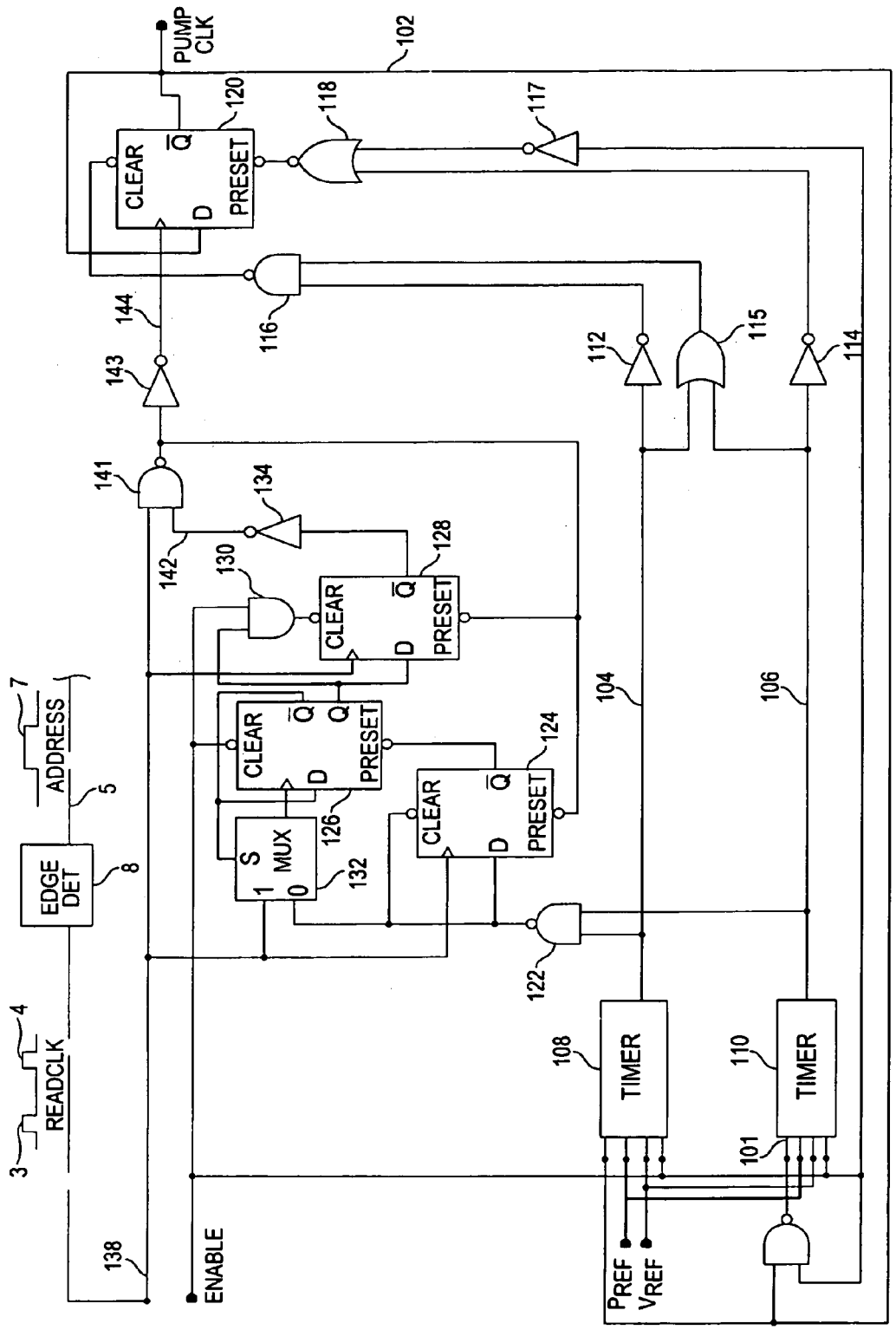
Fig._5

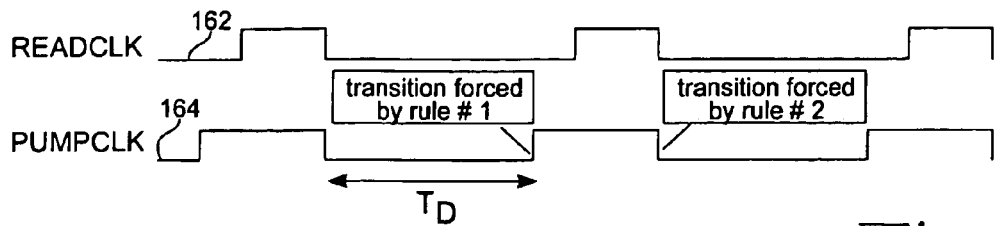
*Fig._ 6A*
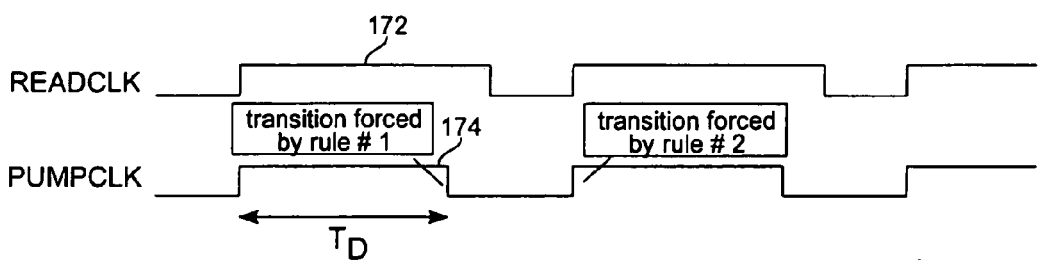
*Fig._ 6B*
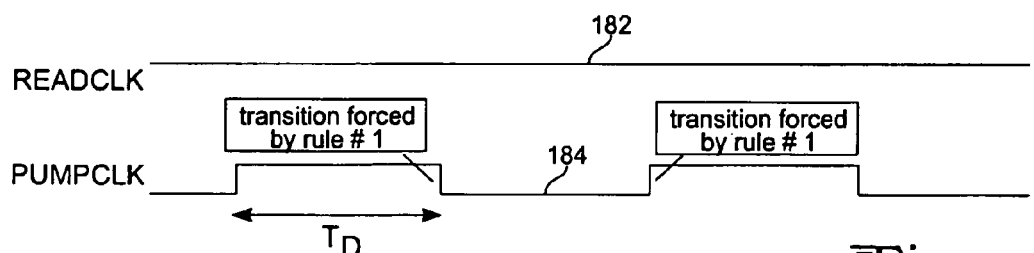
*Fig._ 6C*
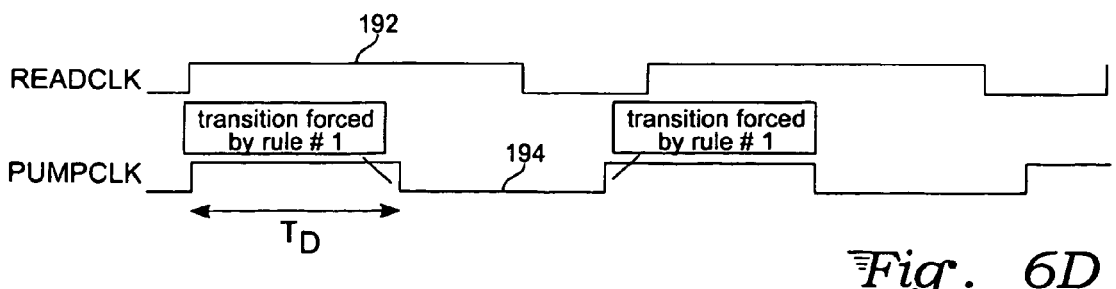
*Fig._ 6D*

CHARGE PUMP CLOCK FOR NON-VOLATILE MEMORIES

TECHNICAL FIELD

The invention relates to a charge pump clock used in a non-volatile memory device, and more particularly, to an accurate clock control circuit for a charge pump used with a non-volatile memory.

BACKGROUND ART

A problem with conventional charge pumps associated with non-volatile memories is unstable voltage regulation because of fluctuating current demand. The fluctuation arises because current demanded from a charge pump used in non-volatile memories is proportional to the frequency at which data is read from the memory. More specifically, address changes cause charge to be drawn from the charge pump that must be replenished by clocking the pump.

Clocking of charge pumps is done at a frequency that can exhibit some variability due to process variables, temperature, voltage changes, but is generally uniform. This is illustrated in FIG. 1 where pump clock frequency is shown as a function of address transitions or address frequency. The charge pump is assumed to operate on both rising and falling edges of an input clock (double edge charge pump) although this assumption is not vital. The invention can also be used with single edge charge pumps. Note that while there can be variability in the pump clock frequency over the range 40 MHz to 50 MHz in the example, the pump clock frequency is flat with changes in the address frequency.

FIG. 2 illustrates a prior art charge pump clock 10 feeding a charge pump 16. The address bus 5 feeds address signals to row decoder 6 that addresses flash memory 20. The address bus also feeds the address transition detector 8 that produces an address clock, readclk, indicative of address transitions at a rate roughly twice the address transition frequency. A readclk signal is fed from detector 8 to multiplexer 24, a switch that is also fed by the internal reference oscillator 22. The output of multiplexer 24, a pumpclk signal, feeds charge pump 16. In turn, charge pump 16 generates an output voltage signal, $V_{READ}$, that is an input for row decoder 6. The output signal, $V_{READ}$, is also sent to a voltage detector 28. If $V_{READ}$ is below a pre-defined voltage, a STOP signal on line 25 is transmitted to multiplexer 24 to temporarily set the output of the multiplexer to correspond to clock edges from the reference clock 22.

Cells of non-volatile memories, such as memory 20, are read by biasing gates with a read voltage and by detecting the current flowing through memory cells. If a cell is programmed, its threshold voltage should be higher than the read voltage, so that no current is drawn by the cell. If the cell is erased, its threshold voltage should be such as to let the current flow through. Detecting the current flow provides for discriminating between programmed and erased cells. To ensure correct read operation and reliable cycling, i.e. multiple cycles of operation of the memory array, certain limits should be observed in the distribution of the threshold voltages of the cells. More specifically, many circuit designs require that the threshold of the best erased cells be above zero, and the threshold voltage of the worst case erased cells be about 2.5V. The lower limit substantially arises from the need to prevent read errors caused by depleted cells, i.e. cells with a threshold voltage below zero. The upper limit is due to the intrinsic distribution of the cell threshold according to the fabrication technology used. Since the read voltage $V_{READ}$ normally coincides with the supply voltage $V_{CC}$, a supply voltage of over 3V poses no problem for some designs. A problem arises in the case of memories operating at low $V_{CC}$. For instance, with a supply voltage $V_{CC}$ of 2.5 V, all the cells with a threshold voltage $V_{TH}$ close to this value conduct little or no current, so that the cell is considered programmed, thus resulting in a read error. A solution to this problem consists of boosting the read voltage, i.e. supplying the gate terminal of the cell to be read with a voltage higher than the $V_{CC}$. With further reference to FIG. 2, the internally generated boosting is preferably done by a charge pump 16 clocked at the address transition frequency determined by address transition detector 8.

A non-volatile memory should guarantee the user correct reading of the data as long as the time elapsing between the supply of two successive addresses to the input of the memory is longer than, or equal to, the memory access time. In other words, the address transition frequency at the input of the memory is lower than, or equal to, the inverse of the memory access time, which is defined as the time elapsing between the instant at which an address is supplied in a stable way to the input of the memory and the instant at which the content of the address is available at the output of the memory.

To guarantee compliance with the specifications regarding reading times, most prior art charge pumps are sized in such a way as to be able to meet the maximum current requirement by the decoding circuitry to which they are connected as long as the addresses vary at a frequency lower than, or, at the most, equal to the inverse of the memory access time. This is done to guarantee that the read voltage $V_{READ}$ remains constant over the value of $V_{REF0}$ within the entire memory operation range.

However, the current required from the charge pump by the decoding circuitry is not constant but is proportional to the frequency at which the addresses at the input of the memory vary, and presents a pulse pattern with peaks at the transitions of the addresses.

A mean value of current <I> is expressed as follows:

$$<I> \approx f_{ADD} \times C_{DEC} \times V_{READ}, \tag{1}$$

that is, the mean value of current <I> is a function of the address transition frequency $f_{ADD}$, the read voltage $V_{READ}$, and the overall capacitance $C_{DEC}$ as "seen" by the row decoder. The mean value of current <I> is maximized when the row decoder "sees" the maximum capacitance.

The maximum voltage $V_{MAX}$ that the charge pump can theoretically supply when the current requirement is zero is:

$$V_{MAX} = (n+1) \times V_{CC} > V_{REF0}, \tag{2}$$

where n is the number of boosters forming the charge pump. The maximum current $I_{MAX0}$ that may be supplied by the charge pump when its output voltage is equal to the supply voltage $V_{CC}$ is as follows:

$$I_{MAX0} = f_{CK} \times C_P \times V_{CC}. \tag{3}$$

The frequency $f_{CK}$ of the clock signal CK, starting from which the phases of a charge pump are generated, is determined in such a way as to guarantee that the read voltage $V_{READ}$ remains constant at the value $V_{REF0}$ within the entire memory operation range, i.e., as long as the frequency of the addresses access $f_{ADD}$ is lower than, or equal to, the inverse of the memory access time, and hence also when the decoding circuitry absorbs the maximum current:

$$f_{ADDRESS\_TRANSITION} \leq 1/T_{MEMORY\_ACCESS}. \tag{4}$$

Most flash non-volatile memories currently available on the market have a memory access time $T_{MEMORY\_ACCESS} \approx 100$ nS. Thus, the maximum allowable address transition frequency $f_{ADDRESS\_TRANSITION} \approx 10$ MHz, and the clock signal CK from which the phases of the charge pump are generated has a frequency such as to guarantee, with a fair margin, that the read voltage $V_{READ}$ will remain constant at the value $V_{REF0}$ referred to above within the entire memory operation range.

U.S. Pat. No. 6,560,145 relates to the problem of where the address transition frequency exceeds the maximum frequency acceptable to an associated non-volatile memory. Where address transitions occur at much higher frequencies than the maximum allowable, the read voltage supplied by the charge pump will be inadequate, i.e. below an established failure voltage, $V_{FAIL}$. During a $V_{FAIL}$ condition a number of memory accesses is halted. The approach taken in the '145 patent is to monitor the phase difference between the charge pump clock and address transitions, then correct accordingly whenever the read voltage drops below a pre-set threshold voltage. This guarantees that the read voltage does not drop below $V_{FAIL}$.

An object of the invention is to devise a charge pump clock that is stable with respect to frequency and voltage, yet allows for increased address transition frequencies with dynamic response as the transitions exceed a predetermined frequency.

SUMMARY OF THE INVENTION

The above object has been met with a charge pump clock associated with a non-volatile memory having a variable but stable frequency and duty cycle for voltage stabilization that depends on the clock or read clock frequency and on the clock or read clock duty cycle. The invention is an adaptive charge pump clock that generates clock edges for the charge pump in a variable manner past a pre-determined address frequency. In one embodiment, the invention generates clock edges at a minimum of $T_D$ seconds apart so long as address transitions do not exceed a pre-determined limit. However, if address changes are occurring more frequently than this limit, i.e. $1/(2*T_D)$, then clock edges will be generated at an adaptive rate that is proportional to the rate of address changes, where $T_D$ is approximately half of the address period.

The charge pump clock of the present invention features a circuit that implements the following two logic rules in relation to read clock pulses supplied by an edge detector, or by an external chip. The edge detector or separate circuit or chip, supplies positive pulses upon each transition of the address. Rule No. 1, implemented by a first logic circuit, requires that (1a) if the pump clock signal is in a first pump clock state for at least a predetermined period of time, the charge pump clock switches the pump clock signal from the first pump clock state to a second pump clock state; and (1b) if the pump clock signal is in the second pump clock state for at least the same predetermined period of time, the charge pump clock switches the pump clock signal from the second pump clock state to the first pump clock state.

Rule No. 2 is implemented by a second logic circuit that looks for an address change causing the pump clock signal to change state from the current state to the opposite state unless: (i) the first logic circuit caused the pump clock signal to change the pump clock signal state; and (ii) the read clock state change is the first one since the most recent pump clock signal state change.

The first logic circuit, implementing Rule No. 1, includes first and second parallel timers. The two timers receive the pump clock output signal and an inverse pump clock output signal. The two timers each have an output supplying a state driver. The state driver also receives an input from the second logic circuit, implementing Rule No. 2. The state driver has an output pump clock signal tracking changes in the address transition frequency, with adjustments in duty cycle.

The present invention provides a pump clock with a variable frequency and duty cycle that depends on the read frequency and duty cycle. With this approach, the charge pump clock edges occur in direct proportion to the load current. The problem of having a fixed clock source with wide frequency variation is eliminated and thus, the charge pump can be smaller, less expensive, and consume less power than with conventional techniques.

BRIEF DESCRIPTION OF THE DRAWINGS

FIG. 1 is a plot of prior art charge pump clock frequency as a function of address frequency.

FIG. 2 is a simplified block diagram of a prior art charge pump clock in relation to a non-volatile flash memory.

FIG. 3 is a simplified block diagram of a charge pump clock of the present invention in relation to a non-volatile flash memory.

FIG. 4 is a plot of charge pump clock frequency as a function of address frequency for the apparatus of FIG. 3.

FIG. 5 is an electrical schematic diagram of the charge pump clock circuit shown in FIG. 3.

FIGS. 6A–6D are timing diagrams showing a readclk signal and a pumpclk signal under different conditions in the charge pump clock of FIG. 5.

BEST MODE FOR CARRYING OUT THE INVENTION

With reference to FIG. 3, the address line 5 feeds edge detector 8 with an address pulse 7, as well as feeding row decoder 6 which accesses flash memory 20. Edge detector 8 produces a pulse 3 on the rising edge of pulse 7 and a pulse 4 on the falling edge of pulse 7. The charge pump clock of the present invention features Rule No. 1 logic indicated by dashed line 11 and Rule No. 2 logic in block 12. Rule No. 2 logic receives an input from edge detector 8 on line 10, an input from timer 18 on line 22, and another input from second timer 17 on line 13. A pump clock state driver 15 is switched between two states by signals on lines 14, 24, and 34 from timers 17, 18 and Rule No. 2 logic block 12. The first and second timers 18 and 17 are typical circuits of conventional analog design, not shown. Output signals on lines 13 and 22 feed Rule No. 2 logic. In turn, the Rule No. 2 logic feeds back to pump clock state driver 15, having a pumpclk output signal on line 21 driving charge pump 16.

In the following discussion, the output signals of the edge detector 8 are termed readclk on line 10 and the output signals of pump clock state driver 15 are termed pumpclk on line 21. The charge pump clock generates pumpclk pulses at a minimum of $T_D$ seconds apart, where $T_D$ is adjustably half of the address period:

$$\text{MIN}\{(\text{Rising edge})(r.e.)\text{pumpclk}-(\text{falling edge})(f.e.)\text{pumpclk}\}=T_D. \quad (5)$$

However, if address changes are occurring more frequently than $1/(2 \times T_D)$, then the charge pump clock generates a clock signal at a rate proportional to the rate of address changes:

if $f_{ADDRESS\_TRANSITION} > 1/(2 \times T_D)$,
$$f_{pumpclk} = f_{ADDRESS\_TRANSITION}. \qquad (6)$$

The comparison logic can be implemented with hardware or software operating by:
(A) observing the edges on readclk and pumpclk; and
(B) based on the observations, the new states are created on pumpclk according to the following rules:
(Rule No. 1) if more than $T_D$ seconds have lapsed since the last state change on pumpclk, then pumpclk is switched from its current logic state to the opposite state;
(Rule No. 2) if readclk undergoes a state change, then a state change is immediately forced on pumpclk unless
(i) the most recent state change on pumpclk was caused by (Rule No. 1); and
(ii) the most recent readclk state change is the first one since the most recent pumpclk state change.

The basic effect of Rule No. 1 is to cause pumpclk to cycle at a minimum frequency of $F_{MIN} = 1/(2 \times T_D)$, even if readclk is not cycling. For example, if $T_D = 25$ nS then pumpclk will always cycle with minimum frequency $F_{MIN}$:

$$\text{pumpclk\_frequency} \geq F_{MIN} = 1/(2 \times 25 \times 10^{-9}) = 10^9/50 = 20 \text{ MHz.} \qquad (7)$$

The basic effect of Rule No. 2 is to cause pumpclk to cycle with frequency pumpclk_frequency faster than $F_{MIN}$ if readclk is cycling with frequency readclk_frequency faster than $F_{MIN}$:

if
$$\text{readclk\_frequency} \geq F_{MIN} \rightarrow \text{pumpclk\_frequency} \geq F_{MIN}. \qquad (8)$$

FIG. 4 illustrates operation of the present invention for a particular process, voltage, operating temperature, etc., and is only valid when the address frequency is in a steady state. The pumpclk frequency (f) is flat in region 42 for address transition frequencies below a nominal reference frequency 44, i.e. an approximation to Rule No. 1. Above the nominal reference frequency in region 46, the pumpclk frequency (f) increases linearly with the address frequency, i.e. an approximation to Rule No. 2. The logic Rules No. 1 and 2 govern operation of the invention, not the simplified circuit of FIG. 3.

The Rule No. 1 logic block 11 and the Rule No. 2 logic block 12 are shown in more detail in FIG. 5. The simplified circuit of FIG. 3 implies that the charge pump clock frequency, pumpclk, is only a function of address frequency. This is not true. A clock that is derived in a similar fashion to that of the prior art described in FIG. 2 can cause glitches due to phases of signals on lines 13 and 22 being misaligned. Rather, the output clock of the present invention follows two logic rules described as Rule No. 1 and Rule No. 2.

The output signal pumpclk on line 102 of FIG. 5 is analogous to the clock signal, pumpclk, on line 21 of FIG. 3 that drives the charge pump 16 on line 21. An address input on line 5 is fed to edge detector 8, shown in dashed lines because it is not part of charge pump clock circuit 100. Some memories do not use an edge detector deriving timing pulses from the address frequency, but rather use a readclk signal from another source that is sometimes used to latch an address into memory. These are regarded to be equivalent. The output of detector 8 is the readclk signal on line 138. The charge pump clock 100 implements the two rules previously described.

Rule No. 1 is implemented by using two conventional timers 108 and 110 in FIG. 5. More specifically, the timer 108 produces a logic "1" output signal on line 104 when a pumpclk signal is "1". The timer 108 will generate a logic "0" output signal on line 104 $T_D$ nS (25 nS in the best mode implementation of the present invention) after the pumpclk signal transitions from "1" to "0". However, if the signal pumpclk rises back to a logic "1" before 25 nS has elapsed the output will remain a logic "1". The timer 110 operates in a similar manner with the inverse of the pumpclk signal on line 101 driving the timer 110.

The pumpclk signal on line 102 drives the first timer 108. The inverse of pumpclk signal on line 101 drives the second timer 110. Immediately after the pumpclk signal on line 102 makes a transition from one state to the opposite state, one of timer output signal on line 104 or timer output signal on line 106 will make a transition to logic "1". This is specific to Rule No. 1. If $T_D$ seconds pass without another transition on line 102, one of the timer outputs 104 and 106 will make a transition to logic "0". The transition of timer output on line 104 or the timer output on line 106 from "1" to "0" will immediately propagate to flip-flop 120 and force the pumpclk signal on line 102 to change logic states.

Rule No. 2 is implemented with most of the remaining circuitry of FIG. 5, consisting of logic gates 122, 124, 126, 132, 128, 130, 134, 141, and 143 in FIG. 5, plus the pump clock state driver, consisting of logic gates 112, 114, 115, 116, 118, 120, and inverter 117. Signals on lines 138 and 142 extend into NAND gate 141 and the output signal on line 144, called clk_pumpclk, goes from inverter 143 into flip-flop 120. Every time there is a state change of the address signal, the edge detector 8 generates positive logic readclk pulses of a few nS in duration on line 138. Unless prohibited by the readclk_pulse_ok signal on line 142, the readclk signal 138 will propogate through NAND gate 141 and inverter 143 becoming clk_pumpclk signal on line 144 which will clock the flip-flop 120 and cause pumpclk signal on line 102 to change state. The readclk_pulse_ok signal on line 142 will be a logic high signal "1" allowing the positive pulse clk_pumpclk on line 144 to clock the flip-flop 120 unless conditions (A) the most recent state change on pumpclk was caused by (Rule No. 1) and (B) the most recent readclk state change is the first one since the most recent pumpclk state change are met.

Thus, the charge pump clock circuit 100 of FIG. 5 of the present invention generates a clock signal (pumpclk on line 102) with a variable frequency and variable duty cycle because the detected address pulse edges giving rise to readclk signals can be changed independently. The charge pump clock edges in pumpclk signal occur in direct proportion to the load current if readclk is greater than a certain frequency. This results in a charge pump that is flexible enough to take into account the variations in temperature, and variations in voltage without using the complicated conventional pump charge design.

The charge pump clock circuit 100 of FIG. 5 is capable of independently changing the rising edge and the falling edge of the pumpclk signal on line 102. This capability of independently changing the rising edge and the falling edge of the pumpclk signal on line 102 allows one to use the present invention not only to accommodate address rate changes, but many other applications, as is illustrated in the following examples.

EXAMPLE NO. 1

FIG. 6A depicts readclk signal 162 cycling at a frequency that is higher than $F_{MIN} = 1/(2 \times T_D)$, whereas the duty cycle of readclk is much less than 50%:

$$\text{readclk\_frequency} \geq F_{MIN} = 1/(2 \times T_D)$$

and $$readclk\_duty\_cycle<50\% \quad (9)$$

The usage of the charge pump clock 100 of FIG. 5 in the charge pump instead of the usage of the conventional oscillator results in generating of the pumpclk signal 164 for the wordline pump which has the same frequency as the frequency of readclk, but with improved duty cycle:

$$pumpclk\_frequency=readclk\_frequency$$

and $$pumpclk\_duty\_cycle>readclk\_duty\_cycle. \quad (10)$$

EXAMPLE NO. 2

FIG. 6B depicts readclk signal 172 cycling at a frequency that is higher than $F_{MIN}=1/(2 \times T_D)$, whereas the duty cycle of readclk is much more than 50%:

$$readclk\_frequency \geq F_{MIN}=1/(2 \times T_D)$$

and $$readclk\_duty\_cycle>50\% \quad (11)$$

The usage of the charge pump clock 100 of FIG. 5 in the charge pump instead of the usage of the conventional oscillator results in generating of the pumpclk signal 174 for the wordline pump which has the same frequency as the frequency of readclk, but with improved duty cycle:

$$pumpclk\_frequency=readclk\_frequency$$

and $$pumpclk\_duty\_cycle<readclk\_duty\_cycle. \quad (12)$$

EXAMPLE NO. 3

FIG. 6C depicts readclk signal 182 that is not cycling at all. However, the charge pump clock 100 of FIG. 5 will generate pumpclk signal 184 for the wordline pump at the frequency $F_{MIN}=1/(2 \times T_D)$ $$readclk\_frequency=0;$$

$$pumpclk\_frequency=F_{MIN}=1/(2 \times T_D). \quad (13)$$

EXAMPLE NO. 4

FIG. 6D depicts readclk signal 192 cycling at a frequency that is lower than $F_{MIN}=1/(2 \times T_D)$, whereas the duty cycle of readclk is such that the negative-going pulse on readclk is shorter than $T_D$:

$$readclk\_frequency<F_{MIN}=1/(2 \times T_D) \quad (14)$$

The charge pump clock 100 of FIG. 5 continues to generate pumpclk signal 194 for the wordline pump at the frequency $F_{MIN}=1/(2 \times T_D)$ but with improved duty cycle:

$$pumpclk\_frequency=F_{MIN}=1/(2 \times T_D);$$

and $$pumpclk\_duty\_cycle<readclk\_duty\_cycle. \quad (15)$$

The present invention has also the advantage that Rules No. 1 and No. 2 prevent generating pumpclk with "glitching" (i.e. having a very narrow clock pulse) when the frequency of readclk rises/falls below that of $F_{MIN}=1/(2 \times T_D)$.

What is claimed is:

1. In a charge pump clock generating a pump clock signal, a logic circuit executing an algorithm with the following steps:
   if said pump clock signal is in a first pump clock state for at least a predetermined period of time, switching said pump clock signal from said first pump clock state to a second pump clock state; and
   if said pump clock signal is in said second pump clock state for at least said predetermined period of time, switching said pump clock signal from said second pump clock state to said first pump clock state; and
   if at a rising edge of a positive logic pulse a read clock signal changes its state from a first read clock state to a second read clock state, or from said second read clock state to said first read clock state, causing said pump clock signal to change said pump clock signal state at a falling edge of said positive logic pulse unless:
   {(i) said pump clock signal changed said pump clock signal state at said rising edge of said positive logic pulse; and (ii) said read clock state change at said rising edge of said positive logic pulse is the first one since said most recent pump clock signal state change}.

2. A charge pump clock for generating a pump clock signal comprising:
   a first and second logic rule circuit means wherein said first logic rule circuit means is arranged for executing the following steps:
   if said pump clock signal is in a first pump clock state for at least a predetermined period of time, switching said pump clock signal from said first pump clock state to a second pump clock state; and
   if said pump clock signal is in said second pump clock state for at least said predetermined period of time, switching said pump clock signal from said second pump clock state to said first pump clock state; and
   wherein said second logic rule circuit means is arranged for executing the following steps:
   if at a rising edge of a positive logic pulse a read clock signal changes its state from a first read clock state to a second read clock state, or from said second read clock state to said first read clock state, causing said pump clock signal to change said pump clock signal state at a falling edge of said positive logic pulse unless:
   {(i) said pump clock signal changed said pump clock signal state at said rising edge of said positive logic pulse; and (ii) said read clock state change at said rising edge of said positive logic pulse is the first one since said most recent pump clock signal state change}.

3. The charge pump clock of claim 2, wherein said first logic rule circuit means comprises:
   a first timer means having a first input receiving said pump clock signal, a second input receiving a reference signal, and an output supplying a first timer signal indicating the outcome of the comparison between said pump clock signal, and said reference signal; and
   a second timer means having a first input receiving an inverse pump clock signal, a second input receiving the reference signal, and an output supplying a second timer signal indicating the outcome of combining said inverse pump clock signal, and said reference signal.

4. The charge pump clock of claim 3, wherein said first timer means includes means for causing said first timer signal to make a transition to a high logic state if said pump clock signal makes a transition from said first logic state to said second logic state, or from said second logic state to said first logic state.

5. The charge pump clock of claim 3, wherein said second timer means includes means for causing said second timer signal to make a transition to a high logic state if said pump clock signal makes a transition from said first logic state to said second logic state, or from said second logic state to said first logic state.

6. The charge pump clock of claim 3, wherein if a predetermined time period lapses without said pump clock signal having a transition from said first logic state to said second logic state, or from said second logic state to said first logic state; said first timer means includes means for causing said first timer signal to make a transition to said low logic state, or said second timer means includes means for causing said second timer signal to make a transition to said low logic state.

7. The charge pump clock of claim 3, wherein said first logic rule circuit means comprises:
 a first logic state means configured to cause said pump clock signal to change its logic state at a rising edge of said positive logic pulse if said first timer signal, or said second timer signal changes its logic state from said high logic state to said low logic state.

8. The charge pump clock of claim 2, wherein said second logic rule circuit means comprises:
 an edge detection means configured to detect a rising edge and a falling edge of an input read clock signal.

9. The charge pump clock of claim 8, wherein, if said input read clock signal changes its state from a logic high state to logic low state, or from said logic low state to said logic high state, said edge detection means includes means for generating a first positive logic pulse, said first positive logic pulse having a rising edge and a falling edge separated by a few nanoseconds in duration.

10. The charge pump clock of claim 7, wherein said second logic rule circuit means further comprises:
 a second logic state means configured to generate a second logic pulse signal that causes said pump clock signal to change its state, unless said first logic state means generates a control signal negating said second logic pulse signal.

* * * * *